(12) United States Patent
Destain et al.

(10) Patent No.: US 8,274,220 B2
(45) Date of Patent: Sep. 25, 2012

(54) LED SOURCE WITH HOLLOW COLLECTION LENS

(75) Inventors: Patrick R. Destain, Allen, TX (US); Stephen J. Willett, Saint Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/159,895

(22) Filed: Jun. 14, 2011

(65) Prior Publication Data

US 2011/0241518 A1 Oct. 6, 2011

Related U.S. Application Data

(63) Continuation of application No. 11/831,171, filed on Jul. 31, 2007, now Pat. No. 8,115,384.

(60) Provisional application No. 60/820,887, filed on Jul. 31, 2006.

(51) Int. Cl.
*H05B 33/00* (2006.01)
*F21V 13/00* (2006.01)

(52) U.S. Cl. ............... 313/512; 313/113; 362/311.02; 362/800

(58) Field of Classification Search ............... None
See application file for complete search history.

(56) References Cited

U.S. PATENT DOCUMENTS

| | | |
|---|---|---|
| 5,022,750 A | 6/1991 | Flasck |
| 5,084,807 A | 1/1992 | McKechnie et al. |
| 5,108,172 A | 4/1992 | Flasck |
| 5,335,158 A | 8/1994 | Kaplan et al. |
| 5,349,509 A | 9/1994 | Klug |
| 5,592,578 A | 1/1997 | Ruh |
| 5,625,738 A | 4/1997 | Magarill |
| 5,738,429 A | 4/1998 | Tagawa et al. |
| 5,772,265 A | 6/1998 | Gilbert |
| 5,882,774 A | 3/1999 | Jonza et al. |
| 5,886,825 A * | 3/1999 | Bietry ............... 359/645 |
| 5,909,322 A * | 6/1999 | Bietry ............... 359/793 |
| 5,962,114 A | 10/1999 | Jonza et al. |
| 6,050,690 A | 4/2000 | Shaffer et al. |
| 6,091,085 A | 7/2000 | Lester |
| 6,188,460 B1 | 2/2001 | Faris |
| 6,200,002 B1 | 3/2001 | Marshall et al. |
| 6,204,523 B1 | 3/2001 | Carey et al. |
| 6,246,446 B1 | 6/2001 | Heimbuch et al. |

(Continued)

FOREIGN PATENT DOCUMENTS

AU 2005/200510 2/2005

(Continued)

OTHER PUBLICATIONS

Riehman et al. "Ultrakompakte Projekionskopfe fur die optische Messtechnik auf der Basis von OLED-Displays", DGaO-Proceedings 2004.

(Continued)

*Primary Examiner* — Ashok Patel
(74) *Attorney, Agent, or Firm* — Kristofer L. Storvick

(57) ABSTRACT

A light source, includes an LED emitter and a meniscus lens having a hollow cavity in which the LED emitter is disposed. The meniscus lens is in exemplary embodiments hyperhemispheric, and it produces a high quality optical image of the LED emitter. The cavity of the lens is filled with air, such as terrestrial atmosphere, inert gas, or vacuum.

20 Claims, 6 Drawing Sheets

U.S. PATENT DOCUMENTS

| | | |
|---|---|---|
| 6,260,973 B1 | 7/2001 | Minato |
| 6,328,447 B1 | 12/2001 | Yamazaki et al. |
| 6,337,536 B1 | 1/2002 | Matsubara et al. |
| 6,485,147 B2 | 11/2002 | Liang |
| 6,486,499 B1 | 11/2002 | Krames et al. |
| 6,520,643 B1 | 2/2003 | Holman |
| 6,527,411 B1 | 3/2003 | Sayers |
| 6,590,235 B2 | 7/2003 | Carey et al. |
| 6,609,795 B2 | 8/2003 | Weber et al. |
| 6,639,706 B2 | 10/2003 | Ziv |
| 6,719,426 B2 | 4/2004 | Magarill et al. |
| 6,721,096 B2 | 4/2004 | Bruzzone et al. |
| 6,729,730 B2 | 5/2004 | Ito |
| 6,772,265 B2 | 8/2004 | Baweja et al. |
| 6,791,749 B2 | 9/2004 | DelPico et al. |
| 6,793,344 B2 | 9/2004 | Kwok et al. |
| 6,830,345 B2 | 12/2004 | Kamm et al. |
| 6,856,466 B2 | 2/2005 | Tocci |
| 6,869,206 B2 | 3/2005 | Zimmerman |
| 6,961,190 B1 | 11/2005 | Tamaoki et al. |
| 6,981,642 B2 | 1/2006 | Krichever |
| 7,046,338 B2 | 5/2006 | McGuire |
| 7,059,728 B2 | 6/2006 | Alasaarela et al. |
| 7,072,096 B2 | 7/2006 | Holman et al. |
| 7,101,050 B2 | 9/2006 | Magarill et al. |
| 7,133,211 B2 | 11/2006 | Kwok |
| 7,168,820 B1 | 1/2007 | Minassian |
| 7,215,882 B2 | 5/2007 | Cho et al. |
| 7,280,288 B2 | 10/2007 | Loh |
| 7,287,861 B2 | 10/2007 | Nakayama |
| 7,300,177 B2 | 11/2007 | Conner |
| 7,352,124 B2 | 4/2008 | Beeson et al. |
| 7,423,297 B2 | 9/2008 | Leatherdale |
| 7,445,340 B2 | 11/2008 | Conner et al. |
| 7,473,013 B2 | 1/2009 | Shimaca |
| 7,479,662 B2 | 1/2009 | Soules |
| 7,540,616 B2 | 6/2009 | Conner |
| 7,717,589 B2 | 5/2010 | Nishioka |
| 7,717,599 B2 | 5/2010 | Grace |
| 7,901,083 B2 | 3/2011 | Destain |
| 2002/0024640 A1 | 2/2002 | Ioka |
| 2002/0057057 A1 | 5/2002 | Sorg |
| 2002/0080622 A1 | 6/2002 | Pashley et al. |
| 2002/0125324 A1 | 9/2002 | Yavid |
| 2002/0126363 A1 | 9/2002 | Ziv |
| 2002/0139984 A1 | 10/2002 | Sugawara et al. |
| 2002/0176015 A1 | 11/2002 | Lichtfuss |
| 2002/0180107 A1 | 12/2002 | Jackson et al. |
| 2002/0180933 A1 | 12/2002 | Ito |
| 2002/0190406 A1 | 12/2002 | Merrill et al. |
| 2003/0048423 A1 | 3/2003 | Aastuen |
| 2003/0117595 A1 | 6/2003 | Li |
| 2003/0147055 A1 | 8/2003 | Yokoyama |
| 2003/0218811 A1* | 11/2003 | Fukasawa ............ 359/853 |
| 2003/0231497 A1 | 12/2003 | Sakata et al. |
| 2004/0099992 A1 | 5/2004 | Merrill et al. |
| 2004/0099993 A1 | 5/2004 | Jackson et al. |
| 2004/0140765 A1 | 7/2004 | Takekuma |
| 2004/0150997 A1 | 8/2004 | Ouderkirk |
| 2004/0174500 A1 | 9/2004 | Ito |
| 2004/0196518 A1 | 10/2004 | Wine et al. |
| 2004/0218387 A1 | 11/2004 | Gerlach |
| 2004/0227898 A1 | 11/2004 | Ma et al. |
| 2004/0264185 A1 | 12/2004 | Grotsch et al. |
| 2005/0001999 A1 | 1/2005 | Eguchi |
| 2005/0006658 A1 | 1/2005 | Ho |
| 2005/0023545 A1 | 2/2005 | Camras et al. |
| 2005/0036119 A1 | 2/2005 | Ruda |
| 2005/0117366 A1 | 6/2005 | Simbal |
| 2005/0135113 A1 | 6/2005 | Wang et al. |
| 2005/0174771 A1 | 8/2005 | Conner |
| 2005/0179041 A1 | 8/2005 | Harbers et al. |
| 2005/0185419 A1 | 8/2005 | Holman |
| 2005/0206770 A1 | 9/2005 | Nathanson |
| 2005/0213057 A1 | 9/2005 | Nakayama |
| 2005/0269587 A1 | 12/2005 | Loh et al. |
| 2005/0269591 A1 | 12/2005 | Hsin Chen et al. |
| 2006/0007538 A1 | 1/2006 | Robinson |
| 2006/0012299 A1 | 1/2006 | Suehiro |
| 2006/0022210 A1 | 2/2006 | Streubel |
| 2006/0034082 A1 | 2/2006 | Park et al. |
| 2006/0039140 A1 | 2/2006 | Magarill |
| 2006/0055838 A1 | 3/2006 | Mi |
| 2006/0066192 A1 | 3/2006 | Beeson |
| 2006/0082560 A1 | 4/2006 | Greer et al. |
| 2006/0083000 A1 | 4/2006 | Yoon et al. |
| 2006/0091411 A1 | 5/2006 | Ouderkirk et al. |
| 2006/0091784 A1 | 5/2006 | Conner et al. |
| 2006/0091798 A1 | 5/2006 | Ouderkirk et al. |
| 2006/0092532 A1 | 5/2006 | Ouderkirk et al. |
| 2006/0102914 A1 | 5/2006 | Smits et al. |
| 2006/0124918 A1 | 6/2006 | Miller et al. |
| 2006/0139575 A1 | 6/2006 | Alasaarela |
| 2006/0139580 A1 | 6/2006 | Conner |
| 2006/0158887 A1 | 7/2006 | Holder |
| 2006/0163590 A1 | 7/2006 | Erchak et al. |
| 2006/0221305 A1 | 10/2006 | Magarill |
| 2006/0232578 A1 | 10/2006 | Reinhorn |
| 2006/0262282 A1 | 11/2006 | Magarill |
| 2006/0262514 A1 | 11/2006 | Conner et al. |
| 2007/0016199 A1 | 1/2007 | Boehm, Jr. et al. |
| 2007/0023941 A1 | 2/2007 | Duncan et al. |
| 2007/0024981 A1 | 2/2007 | Duncan et al. |
| 2007/0030456 A1 | 2/2007 | Duncan et al. |
| 2007/0063647 A1 | 3/2007 | Yu |
| 2007/0085973 A1 | 4/2007 | Duncan et al. |
| 2007/0103648 A1 | 5/2007 | Kojima |
| 2007/0146639 A1 | 6/2007 | Conner |
| 2007/0152231 A1 | 7/2007 | Destain |
| 2007/0153397 A1 | 7/2007 | Destain |
| 2007/0153402 A1 | 7/2007 | Destain |
| 2007/0188864 A1 | 8/2007 | Duncan et al. |
| 2007/0191506 A1 | 8/2007 | Lu et al. |
| 2007/0296921 A1 | 12/2007 | Wang |
| 2007/0297052 A1 | 12/2007 | Wang |
| 2008/0013051 A1 | 1/2008 | Glinski |
| 2008/0036972 A1 | 2/2008 | Phillips, III |
| 2008/0037271 A1 | 2/2008 | Grace |
| 2008/0048553 A1 | 2/2008 | Destain |
| 2008/0051135 A1 | 2/2008 | Destain |
| 2008/0231780 A1 | 9/2008 | Graf et al. |
| 2008/0231953 A1 | 9/2008 | Young |
| 2009/0116214 A1 | 5/2009 | Phillips et al. |
| 2009/0128781 A1 | 5/2009 | Li |
| 2009/0141250 A1 | 6/2009 | Destain |
| 2009/0295265 A1 | 12/2009 | Tabuchi |
| 2009/0310042 A1 | 12/2009 | Vidal et al. |

FOREIGN PATENT DOCUMENTS

| | | |
|---|---|---|
| EP | 0557776 | 9/1993 |
| EP | 0 763 763 | 3/1997 |
| EP | 1 363 335 | 11/2003 |
| EP | 1 387 211 | 2/2004 |
| EP | 1 389 018 | 2/2004 |
| GB | 2 383 428 | 6/2003 |
| GB | 2 413 858 | 11/2005 |
| JP | 9167515 | 6/1997 |
| JP | 2002-43629 | 2/2002 |
| JP | 2003-044839 | 2/2003 |
| JP | 2006-19745 | 1/2006 |
| JP | 2006-067469 | 3/2007 |
| KR | 10-2005-065919 | 6/2005 |
| WO | WO 00/65664 | 11/2000 |
| WO | WO 02/102087 | 12/2002 |
| WO | WO 03/098916 | 11/2003 |
| WO | WO 2004/068602 | 8/2004 |
| WO | WO 2004/084534 | 9/2004 |
| WO | WO 2004/097946 A2 | 11/2004 |
| WO | WO 2005/077002 | 8/2005 |
| WO | WO 2005/078496 | 8/2005 |
| WO | WO 2005/083804 | 9/2005 |
| WO | WO 2005/107420 | 11/2005 |
| WO | WO 2005/119707 | 12/2005 |
| WO | WO 2006/033032 | 3/2006 |
| WO | WO 2006/033245 | 3/2006 |
| WO | WO 2006/036627 | 4/2006 |
| WO | WO 2006/061763 | 6/2006 |

| WO | WO 2006/067469 | 6/2006 |
| WO | WO 2006/124993 | 11/2006 |
| WO | WO 2007/016199 | 2/2007 |
| WO | WO 2007/042711 | 4/2007 |

OTHER PUBLICATIONS

U.S. Appl. No. 60/820,894, filed Jul. 31, 2006.
U.S. Appl. No. 60/820,877, filed Jul. 31, 2006.
U.S. Appl. No. 60/820,883, filed Jul. 31, 2006.
U.S. Appl. No. 60/820,887, filed Jul. 31, 2006.
U.S. Appl. No. 60/820,888, filed Jul. 31, 2006.
U.S. Appl. No. 60/821,032, filed Aug. 1, 2006.
U.S. Appl. No. 60/838,988, filed Aug. 21, 2006.
DailyTech, "TI Pushing DLP Into Mobile Phase", Nirav Sanghani (Blog), Jan. 10, 2007, 6:36 p.m., http://www.dailytech.com/article.aspx?newsid=5671, 3 pgs., downloaded from the internet on Apr. 19, 2011.
Data Management White Papers, silicon.com, http://whitepapers.silicon.com/0,39024759,60243129p-39000676q,00.htm, downloaded Jul. 13, 2007.
Destain, Patrick; Opcon Associates Inc., Description of the Mini-projection Optical design, Jan. 23, 2006.
Digislide: Digismart-Mobile Handset Projection, "Digismart-Minature Projection Technology", http://www.digislide.com.au/consumer/digismart.htm, 2 pgs., downloaded from the internet on Oct. 25, 2007.
DigiTimes daliy IT news, TI shows projection image for mobile phone, http://www.digitimes.com/NewsShow/MailHome.asp?datePublish=2007/3/27&pages=VL&seq=207, Mar. 28, 2007.
Hoelen, C. et al., "Multi-chip color variable LED spot modules", Proceedings of the SPIE, SPIR, Bellingham, VA, US, vol. 5941, Aug. 2, 2005, pp. 59410A-1.
Lo, H. et al.; P-208: Novel Optical Design for Mini-Projector, SID 06 Digest, pp. 1012-1014, 2006.
Murat et al., "Design of new collection systems for multi LED light engines," Proc. of SPIE vol. 6196 619604-1, Apr. 21, 2006.
Search Report for International Application No. PCT/US2007/074830, 4 pgs.
Zou, Hans et al.; 58.1: Single-Panel LCOS Color Projector with LED Light Sources, SID 05 Digest, pp. 1698-1701, 2005.
Written Opinion for International Application No. PCT/US2007/074830, 5 pgs.

* cited by examiner

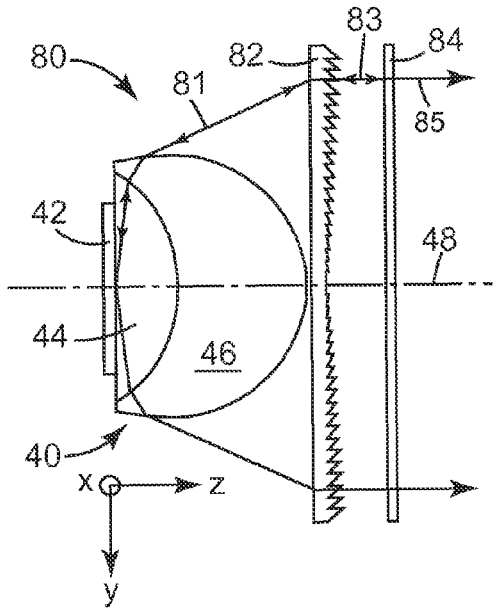
*Fig. 4*
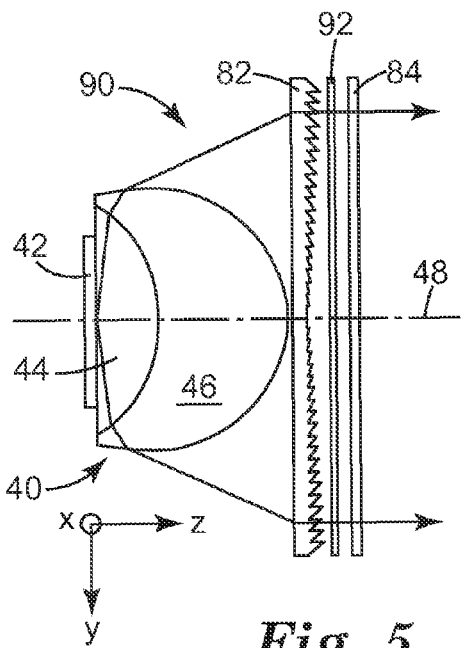
*Fig. 5*
| Element | Focal Length (mm) | |
|---|---|---|
| | Air | Encapsulant |
| $f_{men}$ | 5.66 | 3.25 |
| $f_{col}$ | 7.15 | 7.84 |
| $f_{tot}$ (exact) | 2.92 | 2.36 |
*Fig. 6*

$F_{foc}$ = 13.6 mm $F_{foc}$ = 22 mm

LED SOURCE WITH HOLLOW COLLECTION LENS

CROSS-REFERENCE TO RELATED APPLICATION

This application is a continuation of U.S. application Ser. No. 11/831,171, filed on Jul. 31, 2007 now U.S. Pat. No. 8,115,384, now published as U.S. 2008/0048553, which claims the benefit of U.S. provisional Patent Application Ser. No. 60/820,887, filed Jul. 31, 2006, the content of which is hereby incorporated by reference in its entirety.

Reference is made to commonly assigned U.S. patent application Ser. No. 11/831,198, now published as U.S. 2008/0036972 (Phillips et al.), filed on Jul. 31, 2007; U.S. patent application Ser. No. 11/322,801, filed on Dec. 30, 2005, now issued as U.S. Pat. No. 7,798,678 (Destain); U.S. patent application Ser. No. 11/831,307, filed on Jul. 31, 2007, now issued as U.S. Pat. No. 7,901,083 (Destain et al.); U.S. patent application Ser. No. 11/772,609, filed on Jul. 2, 2007, now published as U.S. Publication No. 2009/0116214 (Phillips et al.); U.S. patent application Ser. No. 11/831,220, filed on Jul. 31, 2007, now published as U.S. Publication No. 2008/0051135 (Destain et al.); U.S. patent application Ser. No. 11/831,263, filed on Jul. 31, 2007, now issued as U.S. Pat. No. 7,717,599 (Grace et al.); and U.S. Patent Application Publication No. US2006/0091411 (Ouderkirk et al.), and U.S. Pat. Nos. 7,304,425 (Ouderkirk et al.), and 7,330,319 (Ouderkirk et al.), all incorporated herein by reference.

BACKGROUND

Light emitting diodes (LEDs) are a desirable choice of light source in part because of their relatively small size, low power/current requirements, rapid response time, long life, robust packaging, variety of available output wavelengths, and compatibility with modern circuit construction. These characteristics may help explain their widespread use over the past few decades in a multitude of different end use applications. Improvements to LEDs continue to be made in the areas of efficiency, brightness, and output wavelength, further enlarging the scope of potential end-use applications.

LEDs are typically sold in a packaged form that includes an LED die or chip mounted on a metal header. The header can have a reflective cup in which the LED die is mounted, and electrical leads connected to the LED die. Some packages also include a molded transparent resin that encapsulates the LED die. The encapsulating resin can have either a nominally hemispherical front surface to partially collimate light emitted from the die, or a nominally flat surface.

Above-mention U.S. application Ser. No. 11/322,801, entitled "LED With Compound Encapsulant Lens", discloses LED sources that include an LED emitter and an encapsulant that at least partially surrounds the emitter. The encapsulant includes an inner lens and an outer lens, the inner lens having a refractive index less than, and in some cases about 70 to 80% of, the refractive index of the outer lens. The inner lens and outer lens can contact each other along a curved surface, and in some cases the inner lens is substantially plano-convex and the outer lens is meniscus. The inner lens produces a first virtual image of the emitter and the outer lens produces a second virtual image, and the first virtual image is disposed between the emitter and the second virtual image. The LED light source is capable of providing uniform illumination in a compact space. The use of a relatively high refractive index inner lens is consistent with contemporary teachings that the extraction efficiency of a high refractive index LED die or chip is increased by encapsulating it in a medium having a refractive index as close as possible to that of the LED die.

The discussion above is merely provided for general background information and is not intended to be used as an aid in determining the scope of the claimed subject matter.

SUMMARY

A light source includes an LED emitter and a meniscus lens having a hollow cavity in which the LED emitter is disposed. The meniscus lens is in exemplary embodiments hyperhemispheric, and it produces a high quality optical image of the LED emitter. The cavity of the lens is filled with air, such as terrestrial atmosphere, inert gas, or vacuum.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 4 shows the light source of FIGS. 2 and 3 with additional optical elements.

FIG. 5 shows the light source of FIGS. 2, 3 and 4 with additional optical elements.

FIG. 6 is a table comparing focal length between LED light sources having, respectively, a hollow meniscus collection lens and a compound encapsulated lens.

DETAILED DESCRIPTION

The present application discloses, among other things, an LED-based source similar to that of the '801 application referenced above, but where the inner lens is replaced by air, which has a refractive index of approximately 1. In this regard, "air" can refer to the terrestrial atmosphere, or any inert gas, or even vacuum. By removing the inner lens, the LED emitter is disposed in the hollow cavity of a lens (referred to as the outer lens in the '801 application) that is preferably both hyperhemispheric and positive meniscus. The lens, referred to herein as a meniscus lens, captures substantially a full hemisphere ($2\pi$ steradians) of light emitted by the LED emitter, and produces a relatively high quality (virtual) image of the emitter with little distortion, using refracting surfaces that are substantially spherical.

Figure 1A:
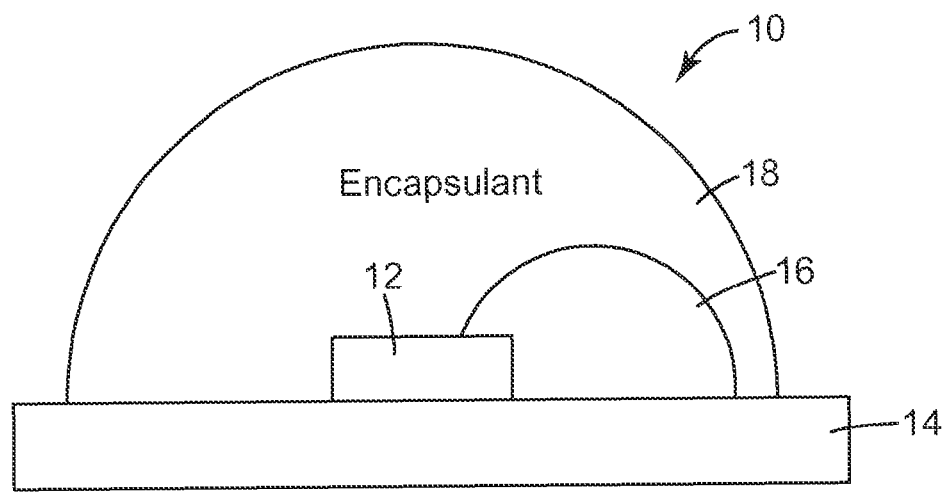
FIG. 1A is a diagrammatic illustration of an encapsulated LED light source.

The disclosed design is in some ways contrary to contemporary teachings that the only way to increase the extraction efficiency of a high refractive index LED die or chip is to encapsulate it in a medium having the highest available refractive index, i.e., as close as possible to that of the LED die. A basic example of an LED light source 10 employing this contemporary teaching is shown in prior art FIG. 1A. LED source 10 includes an LED emitter 12 in the form of a die or chip positioned on a metal header 14. Wire bonds 16 (only one wire bond is illustrated for simplicity) provide electrical connection to the LED emitter 12. An encapsulating material 18, typically a silicone-based gel, encapsulates the LED emitter. Available silicone-based gels have refractive indices of about 1.5, limiting the extraction efficiency to a small percentage.

Figure 1B:
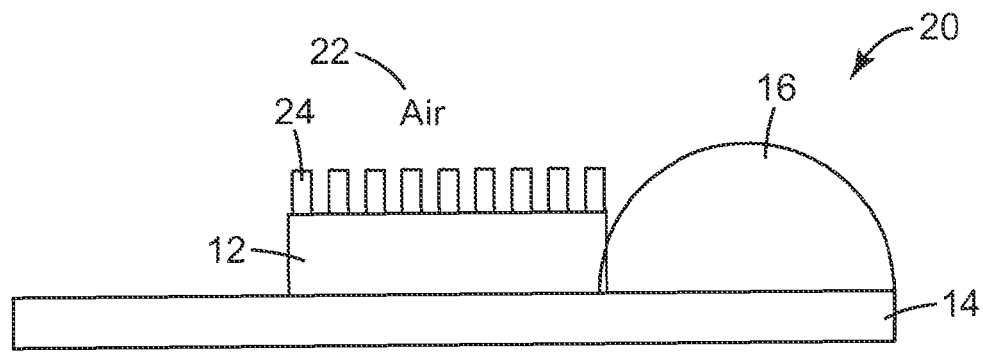
FIG. 1B is a diagrammatic illustration of an un-encapsulated LED light source having light extracting structures.

As discussed, disclosed embodiments depart from conventional encapsulating techniques, and instead utilize an air interface between the LED emitter and a meniscus lens. FIG. 1B illustrates a portion of an LED light source 20 with such an air interface 22 between the LED emitter 12 and a meniscus lens of the source. The meniscus lens is not shown in FIG. 1B, so that other optional features can be better illustrated, but is shown in other FIGS. herein included. In some embodiments, along with a meniscus lens, one or more extraction structures 24 are formed or positioned on the LED emitter 12 to help couple light out of the LED die, thereby preventing the light from being trapped therein and wasted. For example, roughening the emitting surface of the LED die or providing a large number of facets or other structures on such surface, such as sub-wavelength structure, can be used to enhance light extraction from the LED die even in cases where it is exposed to air without an encapsulant. Use of an encapsulant with light extraction microstructures can be detrimental to performance if the refractive index of the encapsulant is less than the refractive index of the LED die with microstructures. Other suitable extraction structures 24 include high extraction photonic crystal structures and wire grid extraction components. Still other suitable extraction structures include glass or ceramic extractors or extractor arrays as disclosed in U.S. Patent Application Publications US2006/0091411 (Ouderkirk et al.) "High Brightness LED Package", US2006/0091798 (Ouderkirk et al.) "High Brightness LED Package With Compound Optical Element(s)", and US2006/0092532 (Ouderkirk et al.) "High Brightness LED Package With Multiple Optical Elements", all incorporated herein by reference. Using the hollow collection (meniscus) lens techniques disclosed herein, the use of extraction structures 24 is possible without interfering with the intended light extracting function of those structures. Although extraction features are not shown in other FIGS. of the present disclosure, each embodiment disclosed herein should be interpreted as optionally encompassing these features, though the features are not required.

As used herein, "light emitting diode" or "LED" refers to a diode that emits light, whether visible, ultraviolet, or infrared. It includes incoherent encased or encapsulated semiconductor devices marketed as "LEDs", whether of the conventional or super radiant variety. If the LED emits non-visible light such as ultraviolet light, and in some cases where it emits visible light, it can be packaged to include a phosphor (or it may illuminate a remotely disposed phosphor) to convert short wavelength light to longer wavelength visible light, in some cases yielding a device that emits white light. An "LED die" is an LED in its most basic form, i.e., in the form of an individual component or chip made by semiconductor processing procedures. For example, the LED die is ordinarily formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can be used also, as might inorganic materials from other groups of the periodic table. The component or chip can include electrical contacts suitable for application of power to energize the device. Examples include wire bonding, tape automated bonding (TAB), or flip-chip bonding. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations. Some packaged LEDs are made by forming a polymer encapsulant over an LED die and an associated reflector cup. The LED die has a quasi-Lambertian emission pattern and much of the light generated within the LED die is trapped due to total internal reflection at the die surface or emitted out of the polymer encapsulant directly above the LED die.

Note that the LED emitter may have only one LED die, or it may have a plurality of dies, which may emit the same or different colors. See, for example, LED die configurations described in commonly assigned U.S. Patent Application entitled "LED Mosaic" (Attorney Docket No. 62370US006), filed on even date herewith and incorporated herein by reference. If multiple LED dies are used, they are typically mounted on a common substrate in close proximity to each other to define a single (but segmented or discontinuous) emitting area.

Figure 2:
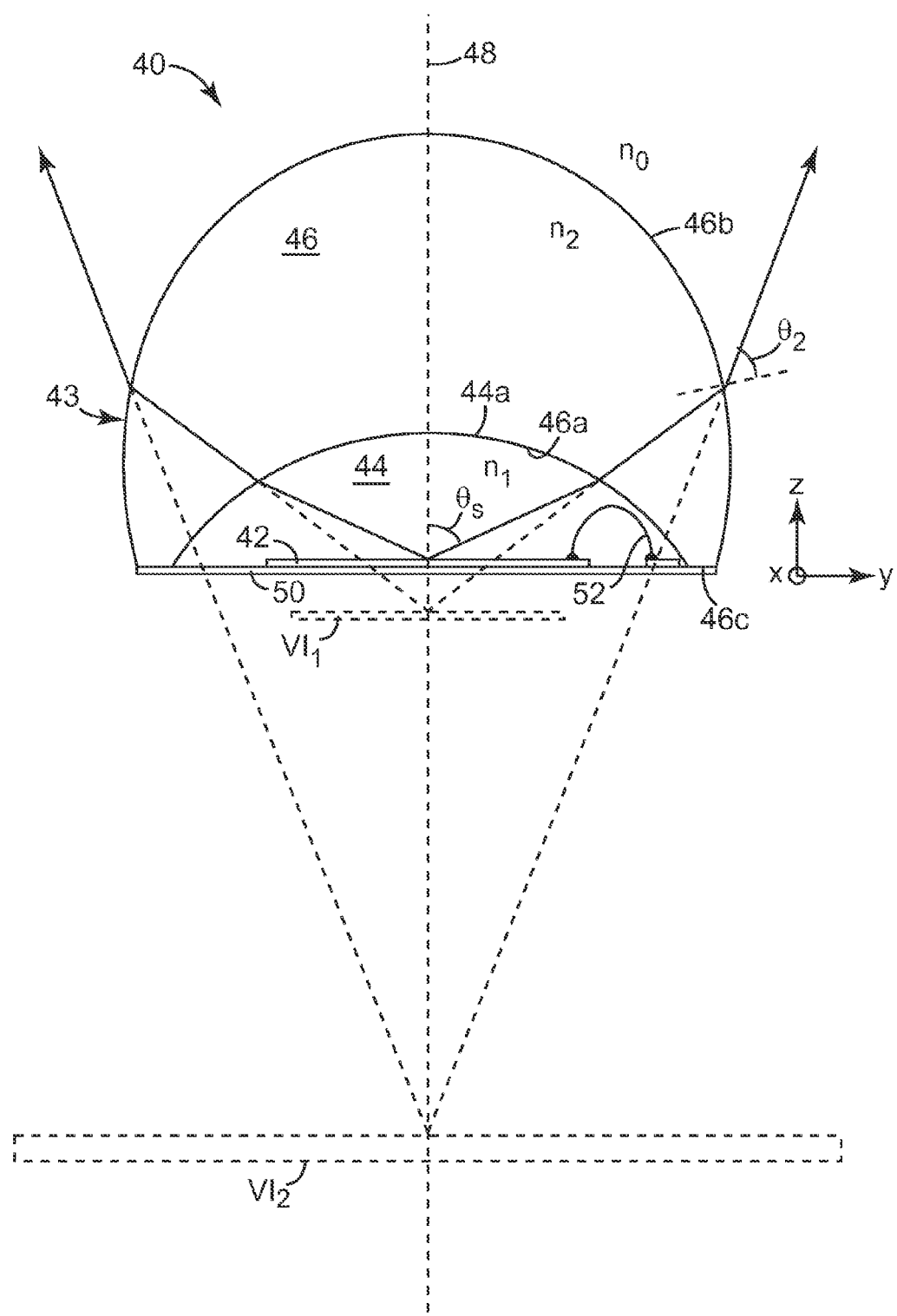
FIG. 2 is a schematic sectional view of an LED light source comprising a hollow meniscus collection lens.
Figure 3:
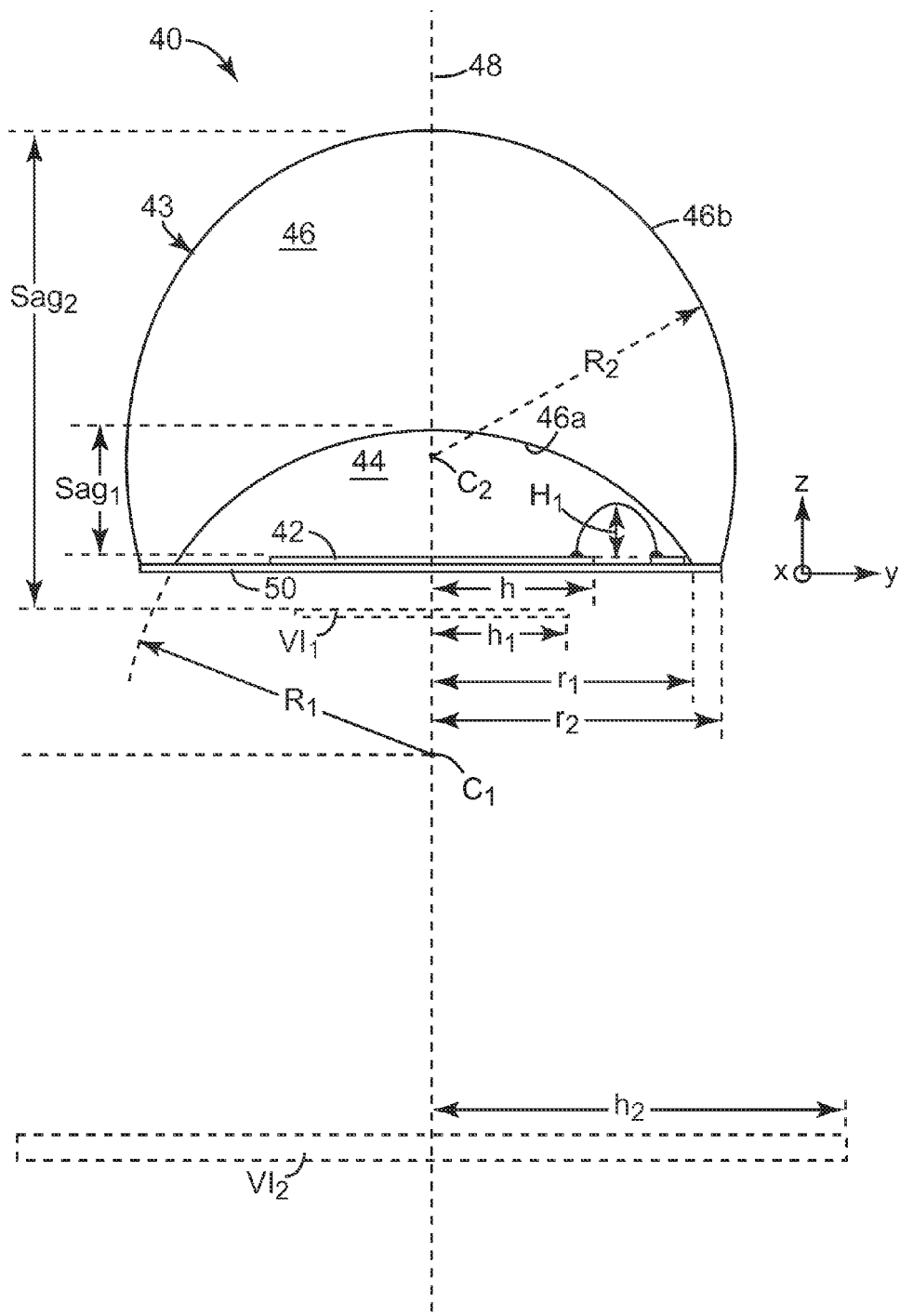
FIG. 3 is another schematic sectional view of the LED light source of FIG. 3.

Turning now to FIG. 2, shown is a light source 40 comprising an LED emitter 42 and an encapsulant 43 that at least partially surrounds the emitter. FIG. 3 depicts the very same light source 40, but identifies additional parameters not shown in FIG. 2 for ease of readability. The LED emitter 42 can be the emitting surface of an LED die or array of dies, or, for example, a thin phosphor layer coated on or otherwise excited by such LED die or dies. In exemplary embodiments, the emitter 42 substantially lies in a plane, corresponding in FIGS. 2-3 to the x-y plane of a Cartesian xyz coordinate system, but other arrangements are also possible. The emitter 42 is a wide-angle source, and although some light may be trapped within the emitter 42 by total internal reflection, light that emerges into the air gap 44 is typically distributed over a full half-hemisphere of solid angle, corresponding to a source angle $\theta_s$ (measured with respect to the local surface normal of the emitter, corresponding to the z-axis in FIGS. 2-3) that ranges from 0 to substantially 90 degrees.

As opposed to the case in the '801 application, where the encapsulant 43 is formed of at least two distinct components, in disclosed embodiments the encapsulant is formed by a meniscus lens 46 which forms an air gap 44 surrounding emitter 42. The outer lens 46 has a curved outer surface 46b exposed to a medium of refractive index $n_o$, typically but not necessarily air. In exemplary embodiments, meniscus lens 46 is substantially rotationally symmetric about an optical axis 48 of the light source, and the emitter 42 is also centered on the optical axis 48, though this need not be the case in all embodiments. For source 40, the optical axis 48 is parallel to the Cartesian z-axis.

The refractive indices of the air gap 44 and meniscus lens 46, $n_1$ and $n_2$ respectively, are unconventional in the sense that $n_1$ (having a value of substantially 1) is a significant decrease from the relatively high refractive index of LED emitter 42, and in that $n_2$ is substantially higher (i.e., at least about 80% higher) than $n_1$. Thus, the ratio $n_1/n_2$ is in exemplary embodiments less than 0.6, and is generally less than 0.5.

In exemplary embodiments, the air gap 44 is contained or sealed in the space between the inner surface 46a of meniscus lens 46 and a substrate 50 on which the LED emitter 42 is mounted, and to which lens 46 is also attached around a periphery thereof. The substrate 50 may be or comprise a substantially flat piece of ceramic, metal, or other suitable material, and may also comprise other components such as metal contacts, pins, and other conventional structures. In some cases the light source 40 may include one or more wire bonds 52 connecting the LED emitter to one or more metal contacts or pins.

In exemplary embodiments, the meniscus lens 46 is composed of a relatively high refractive index glass or other suitable optical material. Typically, this lens will have a refractive index $n_2$ of at least 1.8, and in exemplary embodiments from about 1.9 to 2.1 or about 2. Exemplary materials include sapphire (refractive index 1.77), LASFN9 optical glass (refractive index 1.85), and S-LAH79 optical glass (refractive index 2.003). Meniscus lens 46 can be cast or molded in the shape shown in FIG. 2, or made in the form of a ball or sphere and then machined to form the inner surface 46a and periphery 46c that preferably contacts the substrate 50.

Optically, as a result of the refractive index differences and the shapes of the curved surfaces, inner surface 46a converges light from the emitter 42, forming a first virtual image $VI_1$ of the emitter, and outer surface 46b converges the light still more, forming a second virtual image $VI_2$. The first virtual image is disposed between the LED emitter 42 and the second virtual image. Referring to FIG. 3, the maximum in-plane dimension (i.e., the maximum lateral dimension measured in a plane parallel to the x-y plane) of the LED emitter 42, first virtual image $VI_1$, and second virtual image $VI_2$ are two times the labeled dimensions h, $h_1$, and $h_2$ respectively. Thus, $h_2/h$ is in exemplary embodiments in a range from 3 to 4. Furthermore, in exemplary embodiments, the maximum in-plane dimension of the final virtual image ($VI_2$), which dimension is $2h_2$, is on the order of the maximum in-plane dimension of the outer lens 46. If the outer surface 46b can be fairly characterized by a radius of curvature $R_2$ with a center point $C_2$, this means $2h_2$ is on the order of $2R_2$, for example, $R_2 \leq 2h_2 \leq 4R_2$.

The surfaces 46a and 46b can be spherical or aspherical, but for economy they are in exemplary embodiments substantially spherical, characterized by a first radius of curvature $R_1$ and center point $C_1$ (for surface 46a) and a second radius of curvature $R_2$ and center point $C_2$ (for surface 46b). If the encapsulant is symmetrical, center points $C_1$ and $C_2$ are disposed on the optical axis 48. Other parameters of interest, shown in FIG. 3, include: the axial distance from the top or front surface of LED emitter 42 to the vertex of surface 46a, labeled $Sag_1$; the axial distance from the top or front of the virtual image $VI_1$ to the vertex of outer surface 46b, labeled $Sag_2$; the maximum height of the wire bond 52 relative to the top or front surface of the LED emitter, labeled $H_1$; the maximum in-plane half-width or semi-diameter of surface 46a in the plane of the LED emitter, labeled $r_1$; and the maximum in-plane half-width or semi-diameter of surface 46b of the meniscus lens 46 in the plane of the LED emitter, labeled $r_2$. To minimize the overall size or volume of the source 40, $r_2$ can be selected to be about equal to or only slightly greater than $r_1$.

It is also in many cases desirable to minimize the volume of air gap 44 by judicious selection of, for example, $R_1$ and $Sag_1$. However, rather than minimizing the volume of air gap 44, one may instead select $R_1$ and $Sag_1$ in order to optimize an optical characteristic of the source 40. For example, $R_1$ and $Sag_1$ may be selected to maximize the magnification of the encapsulant 43.

In some cases, it is also desirable to minimize or at least control the amount of spherical aberration and/or coma in the optical system of the light source. Surface 46a can be made aplanatic (i.e., having little or no spherical aberration or coma) by positioning $C_1$ at the intersection of the optical axis 48 and the LED emitter 42, thus making $Sag_1 \approx R_1$, but this is generally incompatible with minimizing the volume of air gap 44, and it also reduces or eliminates the converging power of the surface 46a. Therefore, a more desirable way of controlling spherical aberration and coma can be to design the outer surface 46b to be aplanatic. For an on-axis point, this can be done by setting the distance between the first virtual image $VI_1$ (which acts as an "object" for purposes of the outer lens) and the vertex of the outer surface 46b to be:

$$Sag_2 \approx R_2 * ((n_0 + n_2)/n_2) \quad (1)$$

In cases where $n_2$ is about 2 and $n_0$ is 1 (air), this reduces to:

$$Sag_2 \approx 1.5 * R_2 \quad (2)$$

Note that the foregoing minimum volume and aplanatic conditions can be used as starting points from which further optimization can be done, such as with conventional optical design software. For example, the outer surface 46b can be designed according to Equation (1) above, and then optimized to minimize spherical aberration and/or coma for far off-axis points at or near the edge of virtual image $VI_1$.

The disclosed compact light source can be used in a variety of optical systems, one of which is shown in FIG. 4. In FIG. 4, a collimated light subsystem 80 includes the light source 40 described above, as well as an external collimating lens 82 and an optional reflective polarizer 84. Lens 82 is drawn as a segmented or zoned Fresnel lens for reasons of compactness, but any conventional bulk-optic lens or other known lenses can also be used if desired. For collimation, the focal length and position of lens 82 are selected such that the final virtual image IM2 formed by meniscus lens 46 is disposed at the back focal point of the lens 82. Note that the "collimated" light 83 exiting lens 82 will actually have a nonzero angular spread as a result of the extended nature of the LED emitter 42.

Collimated light subsystem 80 also includes an optional reflective polarizer 84. The polarizer can be used to provide linear, circular, or elliptically polarized light as desired. Although an absorbing polarizer can also be used for this purpose, a reflective polarizer, particularly where the "blocked" polarization state is specularly reflected rather than absorbed or scattered, may provide increased efficiency if a structure or mechanism is present in the light source 40 to convert at least some of the blocked polarization state into the orthogonal "pass" state. This is referred to as "light recycling", and can be accomplished using a number of different techniques.

An example of the recycling reflective polarizer is the multilayer optical polarizing film as described in U.S. Pat. No. 5,882,774 (Jonza et al.), where the alternating layers making up the film have refractive indices along a direction perpendicular to the film that are substantially matched, i.e., $\Delta n_z$ between layers is about zero, so that the reflectivity of any given interface in the film for p-polarized light is substantially constant as a function of incidence angle.

Represented using directional arrows in the light rays 81 and 83 in the top half of FIG. 4, it can be seen that collimated light rays 83 incident upon reflective polarizer 84 are either transmitted toward whatever display or projection system is being illuminated if they are of the correct polarization state (e.g., polarized light rays 85), as dictated by the type of reflective polarizer used, or are reflected back toward collimating lens 82 if they are of the non-desired polarization state. This is true of all light 81 generated by the LED emitter, even though only some of the light rays shown in FIG. 4 are represented with directional arrows.

The light which has been reflected back toward LED emitter 42 can be recycled using any desired technique. For example, LED emitter 42 can include phosphor coatings that may reflect or re-emit recycled light, which then may have the correct polarization state to pass through reflective polarizer 84.

The light source described herein can be combined with a collimating lens and coextruded multilayer reflective polarizer of the type described in U.S. Pat. No. 5,882,774 (Jonza et al.), with anti-reflective coatings applied to both sides of the polarizer, to increase polarized light output by more than 10% (relative to an identical system utilizing an absorbing polarizer rather than the reflective polarizer). Exemplary methods of making coextruded multilayered polarizing films are disclosed in U.S. Patent Application Publications US 2002/0180107 A1 (Jackson et al.), US 2002/0190406 A1 (Merrill et al.), US 2004/0099992 A1 (Merrill et al.), and US 2004/0099993 A1 (Jackson et al.). Further exemplary reflective polarizers include Vikuiti™ dual brightness enhancement films (DBEF) available from 3M Company, St. Paul, Minn. Cholesteric polarizers are also contemplated. As mentioned above anti-reflective coatings can be used on one or both surfaces of the polarizer to minimize losses due to Fresnel surface reflections. Alternatively, the polarizer can be laminated to a smooth preferably flat surface of another optical component such as a lens or plate, or it can be laminated on both sides and sandwiched between two such optical components.

FIG. 5 illustrates another collimated light subsystem 90 including light source 40. Collimated light subsystem 90 can be the same as collimated light subsystem 80 shown in FIG. 4, but with the inclusion of a quarter wave plate (QWP) 92. A QWP is an optical retarding film or component which creates a quarter wavelength phase shift in transmitted light. This can be used to change linearly polarized light to circularly polarized light, and vice versa, to aid in light recycling. For example, LED emitter 42 can include reflective coatings such that some of the light first reflected by reflective polarizer 84 will be retroreflected back toward lenses 46 and 82. QWP 92 can insure that this retroreflected light will have the correct polarization state to pass through reflective polarizer 84.

As has been disclosed, exemplary embodiments of LED light sources mount the LED emitter inside of the air filled cavity of a meniscus lens. One advantage of mounting the LED emitter in the hollow cavity of the meniscus lens can include enabling the use of an LED die with micro-structured extractor surfaces. Another advantage can include the fact that the meniscus lens can provide an excellent sealed cavity package for the die, e.g., when the lens is attached or bonded to the substrate on which the LED die is mounted. This can be particularly beneficial where a micro-structured extractor or the like is used on the top of the active area of the LED die, since the extractor may be highly sensitive to polluted environments such as dust, aerosols, or corrosive gas in the atmosphere that degrade the light extraction efficiency. A similar benefit can be realized if a wire-grid polarizer, also sensitive to polluted environments, is used on the LED die.

The meniscus lens, in an exemplary embodiment made of high refractive index materials as disclosed in the '801 application (e.g., materials whose refractive index is at least 1.8, and generally is from about 1.9 to 2.1, or about 2) still provides a high magnification, reducing the divergence of the Lambertian beam. Relative to the compound encapsulant lens of the '801 application, the meniscus lens alone can provide the same versatility to design compact relay optics to illuminated imagers.

The primary difference between the compound encapsulant lens of the '801 application and the disclosed hollow collection lens embodiments is that the optical power of the latter is lower. Referring to the collimated light subsystem shown in FIG. 4, in comparison to a compound encapsulant lens of the '801 application, in order to maintain collimation after the external collimating lens 82 (which is a Fresnel lens in exemplary embodiments for polarization recycling purposes), the optical power of that Fresnel lens should be increased accordingly. The total power $1/f_{tot}$ of both lenses ($f_{men}$ for the meniscus lens, and $f_{col}$ for the collimating lens) can be approximated as follows:

$$1/f_{tot} (\text{approx}) = (n/f_{men}) + (1/f_{col}) \quad (3)$$

where n~1.5 for gel encapsulant or 1.0 for air. Note that the "collimated" light that exits from lens 82 will actually have a nonzero angular spread as a result of the extended nature of the LED emitter 42. Using conventional optical design software, an exact calculation of $f_{tot}$ can be performed for both designs, i.e., the compound encapsulant lens of the '801 application versus the hollow cavity design disclosed herein, to get a better idea of the power distribution between lenses in both cases. Reference is made to the table shown in FIG. 6. The focal length $f_{tot}$ of the collimated light subsystem is longer in air (2.92 mm) than encapsulated (2.36 mm) for the same ball radius, i.e., for the same outer radius of the meniscus lens.

Figure 7A:
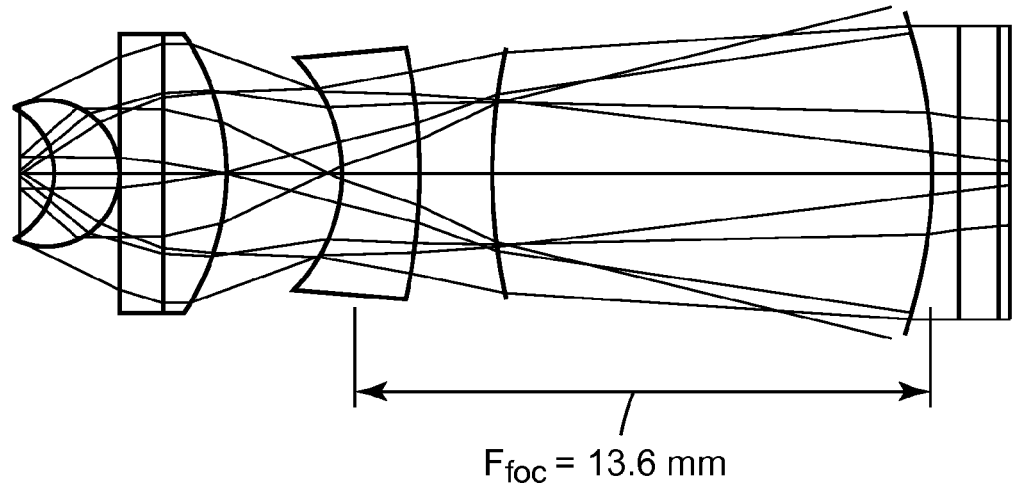
FIGS. 7A and 7B are schematic illustrations of optical layouts of LED light sources having, respectively, a compound encapsulated lens and a hollow meniscus collection lens.
Figure 7B:
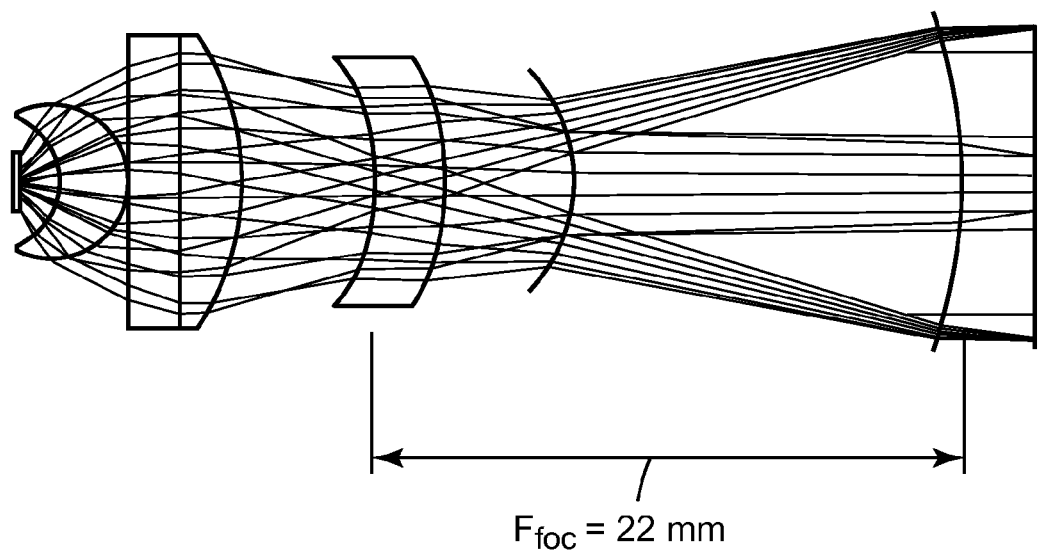

The total illumination system illustrated in FIGS. 7A and 7B comprises the collimated light subsystem described above, plus a second group of lenses that bring the light to an imager. The illumination system being afocal (to allow polarization recycling and/or anamorphic attachment), the focal length $f_{foc}$ of the second group of lenses was chosen to keep the overall magnification of the system unchanged (mag=−4.7 in air). See FIGS. 7A-B, where FIG. 7A shows the optical layout of an illumination system for the compound encapsulant lens of the '801 application, and FIG. 7B shows the optical layout of a similar illumination system using a hollow cavity meniscus lens (i.e., where the inner lens of the other system is replaced with air).

Note that one can slightly decrease the meniscus lens thickness in order to preserve the aplanetic condition in air. Note also that the overall length, volume, and coupling efficiency performance are similar for these two designs.

The disclosed compact light source can also be used in projection systems, such as those incorporating a liquid crystal-on-silicon (LCOS) panel or other pixilated panel. Exemplary projection systems are disclosed in commonly assigned U.S. Patent Application entitled "Optical Projection Subsystem" (Attorney Docket No. 63281US002), filed on even date herewith and incorporated herein by reference.

Figure 8:
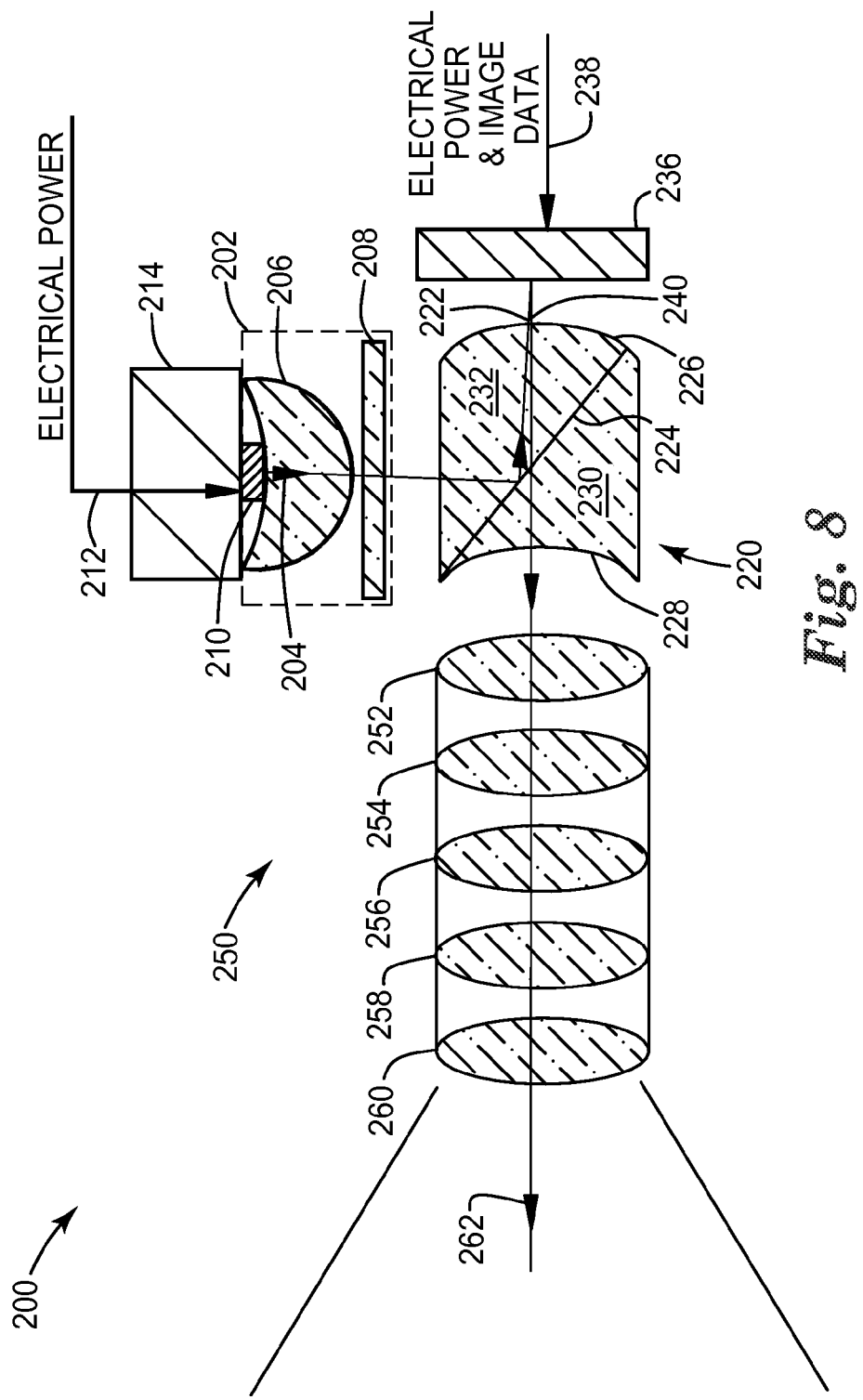
FIG. 8 is a diagrammatic view of a projection system which uses disclosed LED light sources.

For example, FIG. 8 illustrates a projection subsystem 200. The projection subsystem 200 is useful for projecting still or video images from miniature electronic systems such as cell phones, personal digital assistants (PDA's), global positioning system (GPS) receivers. Projection subsystem 200 receives electrical power and image data from the miniature electronic system (not illustrated in FIG. 8) into which it is embedded. Projection subsystem 200 is useful as a component part of a miniature projector accessory for displaying computer video. Projection subsystem 200 is useful in systems that are small enough to be carried, when not in use, in a pocket of clothing, such as a shirt pocket. Images projected by the projection subsystem 200 can be projected onto a retroreflective projection screen, a light-colored painted wall, a whiteboard or sheet of paper or other known projection surfaces. Projection subsystem 200 can be embedded in a portable computer or a cell phone.

Projection subsystem 200 comprises a collimated light subsystem 202, which can be a collimated light subsystem of disclosed embodiments 80, 90, etc. The collimated light subsystem 202 provides a light beam 204. The light engine includes a collection lens 206 (e.g., in the form of meniscus lens 46), a collimator 208 and a solid state light emitter 210. According to one aspect, the collection lens 206 comprises a hyperhemispheric ball lens.

The solid state light emitter 210 receives electrical power 212 with an electrical power level. The solid state emitter 210 thermally couples to a heat sink 214. The solid state light emitter provides an emitter light beam with an emitter luminous flux level. According to one aspect, the light beam 204 comprises incoherent light. According to another aspect the light beam 204 comprises illumination that is a partially focussed image of the solid state light emitter 210. According to yet another aspect the solid state light emitter 210 comprises one or more light emitting diodes (LED's). According to another aspect, the collection lens 206 comprises a hemispheric ball lens. According to another aspect, the collimator 208 comprises a focusing unit comprising a first Fresnel lens having a first non-faceted side for receiving a first non-collimated beam and a first faceted side for emitting the collimated beam; and a second Fresnel lens having a second non faceted side for substantially directly receiving the collimated beam and second faceted side for emitting an output beam. According to another aspect the solid state light emitter 210 can be arranged as shown in U.S. Patent Application entitled "LED Mosaic" (Attorney Docket No. 62370US006), filed on even date herewith and incorporated herein by reference. According to another aspect the collimated light subsystem 202 can be arranged as shown in U.S. Patent Application entitled "Integrating Light Source Module" (Attorney Docket No. 62382US008), filed on even date herewith.

The projection subsystem 200 comprises a refractive body 220. The refractive body 220 receives the light beam 204. The refractive body 220 provides a polarized beam 222. The refractive body 220 includes an internal polarizing filter 224. One polarized component of the light beam 204 is reflected by the internal polarizing filter 224 to form the polarized beam 222. According to one aspect, the refractive body is formed or utilized according to one or more aspects of US Patent Publication US 2007/0023941 A1 Duncan et al., US Patent Publication US 2007/0024981 A1 Duncan et al., US Patent Publication US 2007/0085973 A1 Duncan et al., and US Patent Publication US 2007/0030456 Duncan et al., all incorporated herein by reference.

The refractive body 220 comprises a first external lens surface 226 and a second external lens surface 228. According to one aspect, the external lens surfaces 226, 228 have curved lens surfaces and have non-zero lens power. According to another aspect, the external lens surfaces 226, 228 are flat. According to one aspect, the refractive body 220 comprises plastic resin material bodies 230, 232 on opposite sides of the internal polarizing filter 224. According to another aspect, the internal polarizing filter 224 comprises a multilayer optical film. According to another aspect, the refractive body 220 comprises a multifunction optical component that functions as a polarizing beam splitter as well as a lens. By combining the polarizing beam splitter and lens functions in a multifunction refractive body, losses that would otherwise occur at air interfaces between separate beam splitters and lenses are avoided.

The projection subsystem 200 comprises an image-forming device 236. The image-forming device 236 receives image data on electrical input bus 238. The image-forming device 236 receives the polarized beam 222. The image-forming device 236 selectively reflects the polarized beam 222 according to the image data. The image-forming device 236 provides the image 240 with a polarization that is rotated relative to the polarization of the polarized beam 222. The image-forming device 236 provides an image 240 to the refractive body 220. The image 240 passes through the internal polarizing filter 224. According to one aspect, the image-forming device 236 comprises a liquid crystal on silicon (LCOS) device.

The projection subsystem 200 comprises a projection lens assembly 250. The projection lens assembly 250 comprises multiple lenses indicated schematically at 252, 254, 256, 258, 260. The projection lens assembly 250 receives the image 240 from the refractive body 220. The projection lens assembly 250 provides an image projection beam 262 having a projected luminous flux level that is suitable for viewing.

Unless otherwise indicated, all numbers expressing feature sizes, amounts, and physical properties used in the specification and claims are to be understood as being modified by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

Various modifications and alterations of this invention will be apparent to those skilled in the art without departing from the scope and spirit of this invention, and it should be understood that this invention is not limited to the illustrative embodiments set forth herein. All U.S. patents, patent application publications, and other patent and non-patent documents referred to herein are incorporated by reference in their entireties, except to the extent any subject matter therein is inconsistent with the foregoing disclosure.

What is claimed is:

1. A light source comprising:
   an LED emitter having a width 2h; and
   a meniscus lens having a hollow cavity;
     wherein the LED emitter is disposed in the cavity, and;
     wherein light is produced by the LED emitter, refracted by the meniscus lens and forms a first and second virtual image of the LED emitter, the second virtual image being disposed on the side of the LED emitter opposite the meniscus lens, and the first virtual image disposed between the LED emitter and the second virtual image, the second virtual image having a width $2h_2$, wherein $h_2/h$ is between 3 and 4.

2. The light source of claim 1, wherein the meniscus lens is composed of a material whose refractive index is at least 1.8.

3. The light source of claim 2, wherein the refractive index is at least 1.9.

4. The light source of claim 1, wherein the cavity is filled with a medium selected from the group of terrestrial atmosphere, an inert gas, or vacuum.

5. The light source of claim 4, wherein the LED emitter is immediately adjacent to the vacuum.

6. The light source of claim 1, further comprising a substrate on which the LED emitter is mounted, and wherein the meniscus lens is bonded to the substrate so that the cavity is sealed.

7. The light source of claim 1, wherein the LED emitter comprises a light extraction structure on an emitting surface thereof.

8. The light source of claim 7, wherein the light extraction structure comprises a photonic crystal structure or a wire grid extraction component.

9. The light source of claim 1, and further comprising:
a collimating lens positioned to receive light from the LED emitter through the meniscus lens;
a reflective polarizer positioned to receive light from the LED emitter through the collimating lens, the reflective polarizer transmitting therethrough collimated light having a first polarity, the reflective polarizer reflecting light having a second polarity back toward the LED emitter for light recycling.

10. The light source of claim 9, and further comprising a quarter wave plate positioned between the collimating lens and the reflective polarizer.

11. A light source comprising:
an LED emitter; and
a meniscus lens having a hollow cavity and having an outer surface characterized by a radius of curvature R;
wherein the LED emitter is disposed in the cavity, and;
wherein light is produced by the LED emitter, refracted by the meniscus lens and forms a first and second virtual image of the LED emitter, the second virtual image being disposed on the side of the LED emitter opposite the meniscus lens and the first virtual image disposed between the LED emitter and the second virtual image, the second virtual image having a width $2h_2$, wherein $2h_2$ is greater than R and less than 4 R.

12. The light source of claim 11, wherein the meniscus lens is composed of a material whose refractive index is at least 1.8.

13. The light source of claim 12, wherein the refractive index is at least 1.9.

14. The light source of claim 11, wherein the cavity is filled with a medium selected from the group of terrestrial atmosphere, an inert gas, or vacuum.

15. The light source of claim 14, wherein the LED emitter is immediately adjacent to the vacuum.

16. The light source of claim 11, further comprising a substrate on which the LED emitter is mounted, and wherein the meniscus lens is bonded to the substrate so that the cavity is sealed.

17. The light source of claim 11, wherein the LED emitter comprises a light extraction structure on an emitting surface thereof.

18. The light source of claim 17, wherein the light extraction structure comprises a photonic crystal structure or a wire grid extraction component.

19. The light source of claim 11, and further comprising:
a collimating lens positioned to receive light from the LED emitter through the meniscus lens;
a reflective polarizer positioned to receive light from the LED emitter through the collimating lens, the reflective polarizer transmitting therethrough collimated light having a first polarity, the reflective polarizer reflecting light having a second polarity back toward the LED emitter for light recycling.

20. The light source of claim 19, and further comprising a quarter wave plate positioned between the collimating lens and the reflective polarizer.

* * * * *

UNITED STATES PATENT AND TRADEMARK OFFICE
CERTIFICATE OF CORRECTION

PATENT NO.         : 8,274,220 B2                                   Page 1 of 1
APPLICATION NO.    : 13/159895
DATED              : September 25, 2012
INVENTOR(S)        : Patrick Destain et al.

It is certified that error appears in the above-identified patent and that said Letters Patent is hereby corrected as shown below:

Cover Page, Column 2, (Attorney, Agent, or Firm)
Delete "Kristofer" and insert -- Kristofor --, therefor.

Page 3, Column 2, (Other Publications)
Delete "Minature" and insert -- Miniature --, therefor.
Delete "daliy" and insert -- daily --, therefor.

Column 4
Line 49, delete "n$_o$," and insert -- n$_0$, --, therefor.

Column 8
Line 43, delete "aplanetic" and insert -- aplanatic --, therefor.

Signed and Sealed this
Thirteenth Day of November, 2012

David J. Kappos
*Director of the United States Patent and Trademark Office*